United States Patent [19]

Mitchell

[11] Patent Number: 4,804,908
[45] Date of Patent: Feb. 14, 1989

[54] DIGITAL METER

[76] Inventor: Roger E. Mitchell, 3710 Vincent Ave. S., Minneapolis, Minn. 55410

[21] Appl. No.: 99,657

[22] Filed: Sep. 21, 1987

Related U.S. Application Data

[63] Continuation of Ser. No. 538,108, Oct. 3, 1983, abandoned.

[51] Int. Cl.$^4$ .................. G01R 1/04; G01R 31/36
[52] U.S. Cl. ..................................... 324/115; 324/157
[58] Field of Search .................. 324/115, 99 D, 73 R, 324/133, 426, 435, 62 R, 149, 157, 156

[56] References Cited

U.S. PATENT DOCUMENTS

| | | | |
|---|---|---|---|
| 1,387,907 | 8/1921 | Recker | 339/276 R |
| 2,703,872 | 3/1955 | Doane | 339/262 R |
| 2,791,748 | 5/1957 | Mitchell | 324/149 |
| 4,238,728 | 12/1980 | Wells, Jr. et al. | 324/149 |

OTHER PUBLICATIONS

Mewett, R., "Design Considerations for a Field-Service Digital Multimeter", Control & Instrumentation, Oct. 1977, pp. 25-27.

Primary Examiner—Jerry Smith
Assistant Examiner—Stephen M. Baker
Attorney, Agent, or Firm—Merchant, Gould, Smith, Edell, Welter & Schmidt

[57] ABSTRACT

A digital voltage and continuity test instrument for use by electricians is disclosed. AC, DC and continuity test functions are provided with the AC and DC test modes including auto-zeroing. In a continuity test mode the continuity of the probe leads or the continuity of a circuit may be detected and indicated with a zero-display value. With the probes open circuit in the continuity mode the display provides a reading proportionate to the battery voltage level of the instrument. The electrical test circuitry includes a resistive divider network connected between the test probes, an AC rectifier for demodulating AC voltages received from the resistor divider network and an analog to digital convertor for receiving DC voltages from the resistive divider network or from the demodulator for driving the display according to the magnitude of the received voltage. Strain relief is provided for the test leads and includes an eyelet having a first washer-like end and a second tubular portion for receiving a test lead. The tubular portion is crimped on the lead and the conductor is soldered thereto. The eyelet is positioned within the housing with the washer-like end is positioned near the housing lead aperture so that stress applied to the lead is applied to the inside of the housing through the eyelet.

6 Claims, 4 Drawing Sheets

DIGITAL METER

This is a continuation, of application Ser. No. 538,108, filed Oct. 3, 1983 now abandoned.

TECHICAL FIELD OF THE INVENTION

The present invention generally pertains to the field of electrical test instruments and more particularly to test instruments for use by electricians.

BACKGROUND OF THE INVENTION

The electrician is often called upon to work with a large number of wires, many times bundled, some of which may be live and others dead. Although usually color coded for identification, their condition, i.e. either live or dead, needs to be routinely verified before they are handled. In a typical days work perhaps hundreds of tests must be performed to determine voltage levels or to verify continuity, before and after wiring operations.

In a series of wiring operations it may be necessary to perform various tests. For example, when working with household voltages one might first test for AC voltage (or for DC voltage in certain countries), then perhaps for DC offset, to be certain that a wire is safe for handling. After the wiring operation is completed a test for continuity may be done. And after power is reapplied, then usually another test of voltage to be certain the operation is properly done. The voltages encountered can and do vary over a wide range, i.e. from zero to over six hundred volts in some situations, and thus the test instrument must not only provide AC, DC and continuity modes, but must also accommodate this wide range of voltage levels.

To be efficient in his work, an electrician needs a single instrument capable of performing the above-noted tests quickly and safely. The instrument must be easy to hold, eaasy to set, easy to read, and foolproof. Unfortunately, digital voltage testers have heretofore been lacking in one way or another, especially from a practical point of view. They either are too complicated for efficient, safe and reliable operation, absent sufficient capability to be practically useful, lacking in sufficient safeguards or self testing capability to assure reliability, or are too bulky or flimsy.

They have not, as the present invention does, coordinated the incorporated test functions to achieve the flexability and ease of operation that is really needed.

SUMMARY OF THE INVENTION

The present invention provides a digital voltage and continuity test instrument for use by electricians. AC, DC and continuity test functions are provided. The AC and DC test modes include auto zeroing to eliminate the need for pretest calibration and auto racing to eliminate the need for scaling adjustments. In the continuity test mode, which may be used to test the continuity of the probe leads or the continuity of a circuit, the instrument display provides an open circuit reading proportionate to the battery voltage level of the instrument whereby battery exhaustion may be detected while at the same time sensed continuity may be distinguished from open circuit conditions. Even though there are no fuses, applying voltage to the meter while in the continuity mode will not harm the meter, as protected against by bypass resistance in the meter circuit.

The electrical test circuitry includes a resistive divider network connected between the electrical test probe leads for stepping down applied test voltages and an AC rectifier for receiving a stepped down AC voltage and producing a DC rectified voltage proportionate thereto. A digital numerical LCD display is provided, and is driven by an analog to digital convertor which receives a test voltage differential and drives the display accordingly to the magnitude thereof.

A slide switch is provided for applying the output of the AC rectifier to the converter in the AC test mode, for applying the output of the resistive divider network to the convertor in the DC test mode and for applying a battery supplied voltage bias between probes in the continuity mode when the probes are open circuit.

A housing is provided that includes means for securing the test circuit therewithin with the leads and probes outside and the LCD display and switch accessible by apertures. Strain relief means are provided for mechanically anchoring each lead to the housing and include an eyelet having a first washer-like end and second tubular portion extending therefrom and sized to receive a lead snugly, the tubular portion slightly reduced in diameter near the end opposite the washer 5 portion to provide an abuttment for the lead insulator. The tubular portion is mechanically crimped around the lead and electrically connected to the lead by soldering. The eyelet is positioned within the housing with the washer-like end facing outwardly and the lead extending through a hole in the housing so that full stress is applied to the inside walls of the housing, and not to the electrical connection with the test circuit.

DETAILED DESCRIPTION OF THE INVENTION

Figure 1:
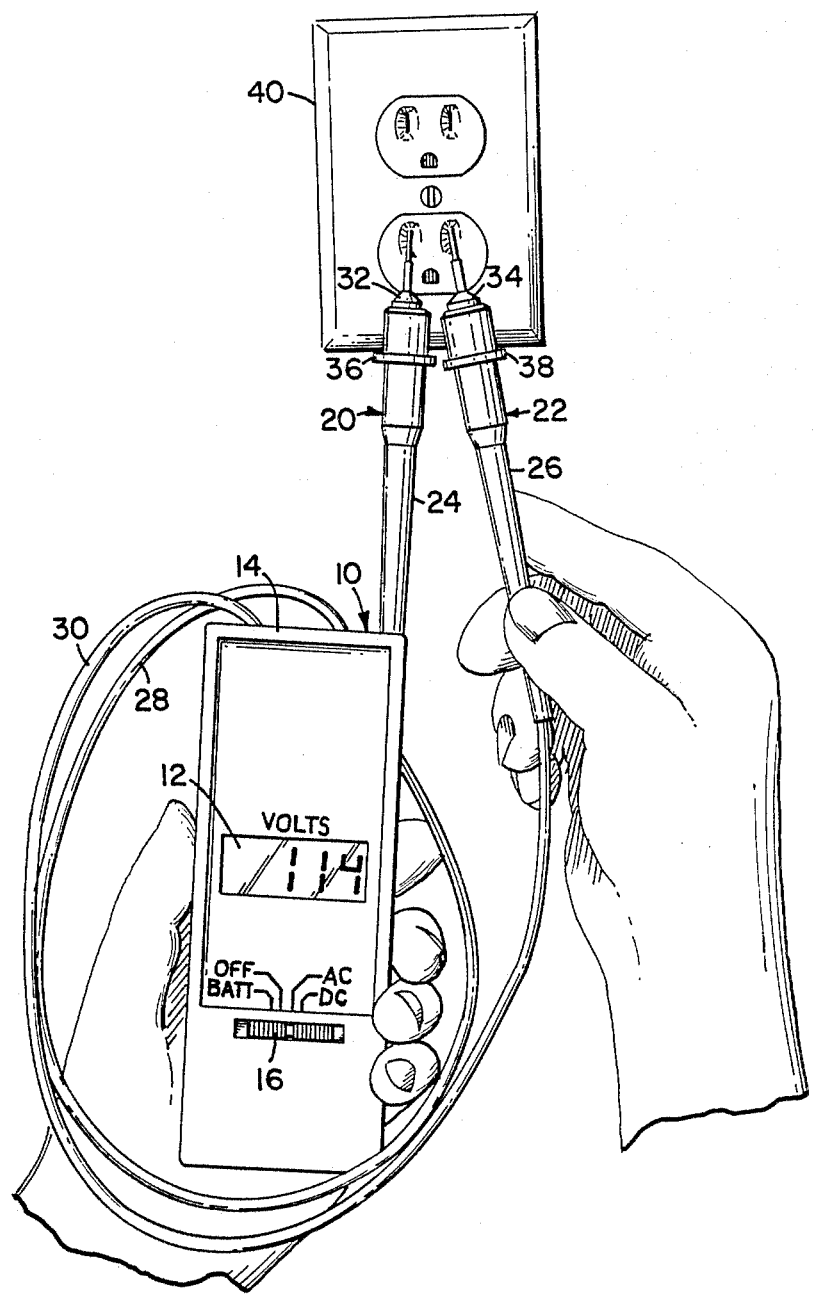
FIG. 1 is a perspective view of the voltage meter according to the present invention in operation.

Referring to FIG. 1 the digital voltage and continuity tester according to the present is shown in use. The housing 10 is shown in scale with the human hand. A display 12, preferably a 3½ digit LCD display, is located approximately center the front panel 14. A switch 16 provides for selection between two voltage measuring modes, AC and DC, OFF, and a combination battery and continuity position, BATT.

Probes 20 and 22 are nonremovably connected both mechanically and electrically to the meter 10, and each include handles 24 and 26 respectively. Lead wires 28 and 30 each extend through cylindrical openings along the longitudinal axes of probes 20 and 22 respectively, and are mechanically secured and soldered to the respective metal probes 32 and 34. Probes 20 and 22 further include integral safety barriers 36 and 38 respectively, which are generally in the shape of a ring around the enlarged tip portions of handles 24 and 25, whereby inadvertent slippage of the hand to an exposed probe is prevented. As shown in FIG. 1, probe 24 may be mounted in a socket provided along the side of housing 10 (as will be shown in more detail hereinlater) so that one hand may be used both to hold the housing and a test probe, for example in position in an outlet 40, while the other hand positions the second probe.

Figure 3:
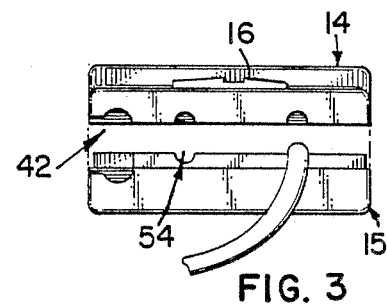
FIG. 3 is an end view of the voltage meter according to the present invention.
Figure 2:
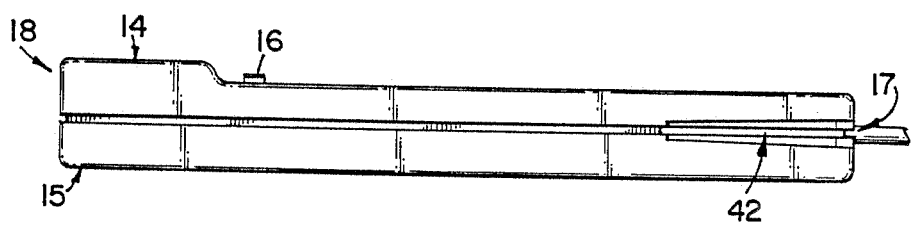
FIG. 2 is a side elevation of the voltage tester according to the present invention.

Referring to FIGS. 2 and 3, side and end views of the housing 10 may be seen respectivevly. Housing 10 comprises a front panel 14 and base 15 secured together when assembled by screws or other suitable means. Probe mounting socket 42 extends along the side of the housing 10 and is formed in part by front panel 14 and base 15. As shown in FIG. 3 a semi-circular opening is provided to accommodate the generally cylindrical nature of the probe handles 24 or 26. Socket 42 is slightly conical, narrowing from end 17 towards end 18, whereby a probe handle may be wedged therein. Housing 10 includes an enlarged battery compartment section between switch 16 and end 18 within which a conventional 9 volt transistor battery may be retained. Access to the battery compartment is gained through a removable panel (not shown) in base 15.

Figure 4:
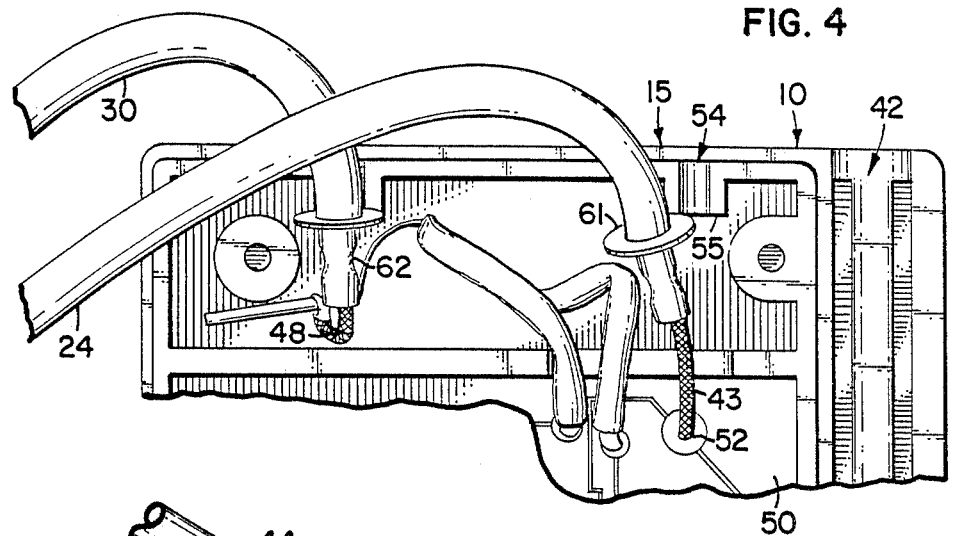
FIG. 4 is a partial plan view inside the housing of the voltage meter according to the present invention.
Figure 5:
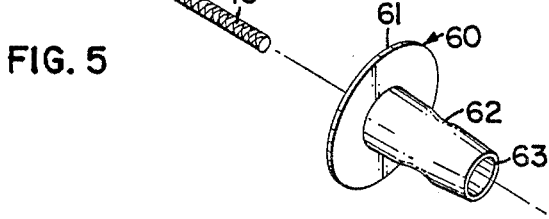
FIG. 5 is an exploded perspective view of the test lead and strain relief means illustrated in FIG. 4.
Figure 6:
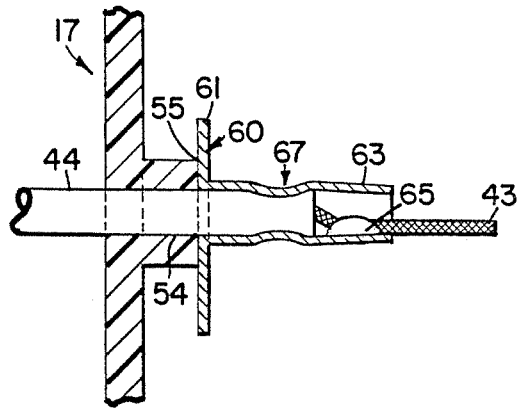
FIG. 6 is a cross sectional view taken along the lines 6—6 of FIG. 4.

As may be seen with reference to FIGS. 4, 5 and 6, test leads 28 and 30 each include a braided wire electrical conductor 43 which is highly flexible and reliable even after extreme bending thereof. Conductor 42 is encased in a silicone insulator 44, and soldered to circuit board 50, which generally retains circuit 150 (FIG. 7) and is secured to the base 15 between the upper edge of display 12 and end 15. Both conductor and insulator are mechanically secured to the housing 10 as follows. An eyelet shaped member 60 having a washer like end 61 and including a tubular portion 62 is sized to receive the insulator 44 into abutment with a slightly narrowed tip 63. Once inserted, portion 62 is mechanically crimped (67) on insulator 44 so as to grip it, and wire 43 is soldered thereto. Conductor 43 may then be soldered to circuit board 50, as shown at reference number 52. When assembled, the lead is positioned in a channel 54 provided in the base 15 at end 17 of the housing. A corresponding channel is provided on the front panel 14 half of housing 10 to provide a cylindrical passage through the of housing 10 when assembled. Thus, this arrangement assures that any strain exerted (up to 35 lbs.) on either the conductor or the insulator is primarily exerted on the inside end 55 of housing channel 54, through the eyelet 60. Although not explicitly shown herein a similar strain relief arrangement may be used in the probe assembly.

Figure 7:
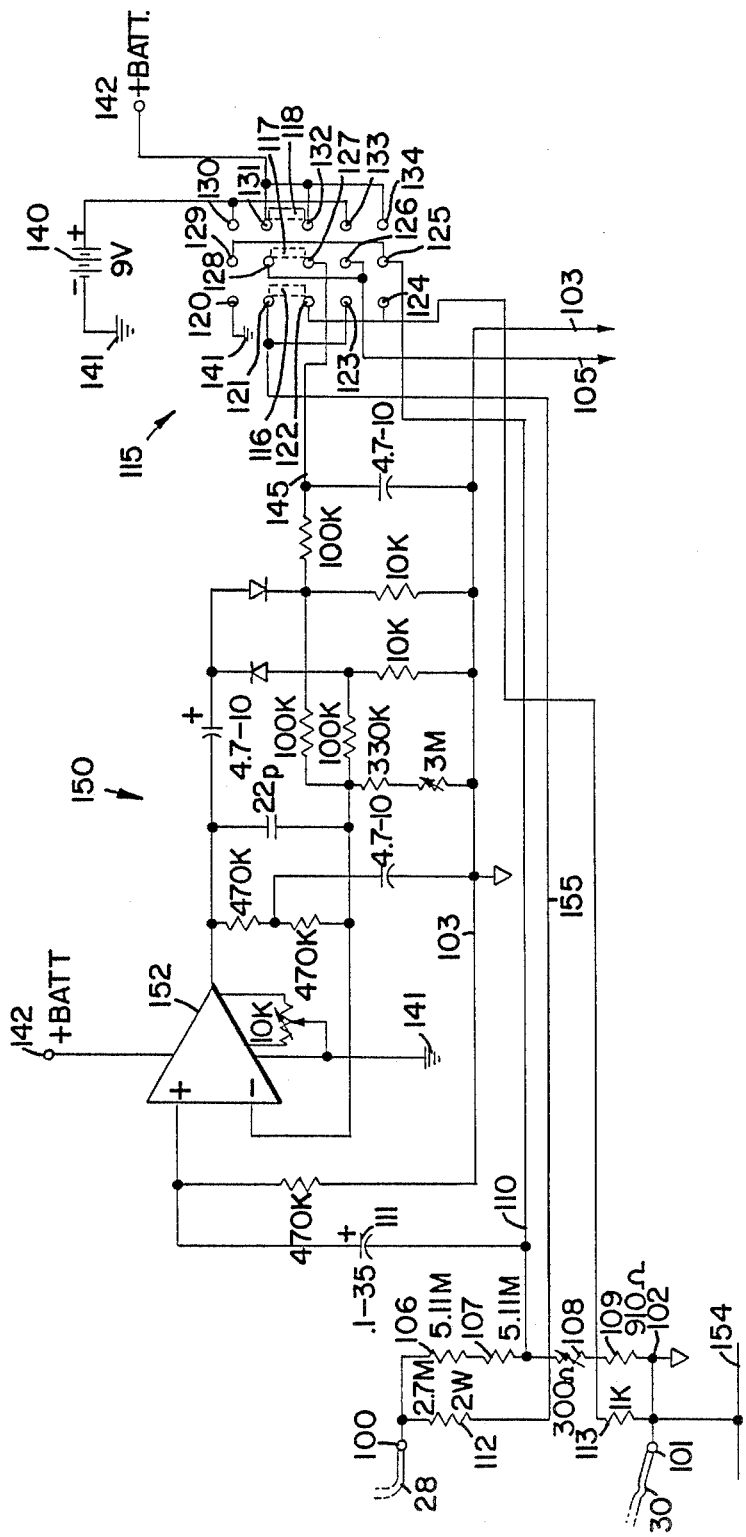
FIGS. 7, 7A and 7B comprises an electrical schematic of the electronic circuits of the voltage meter according to the present invention.
Figure 7A:
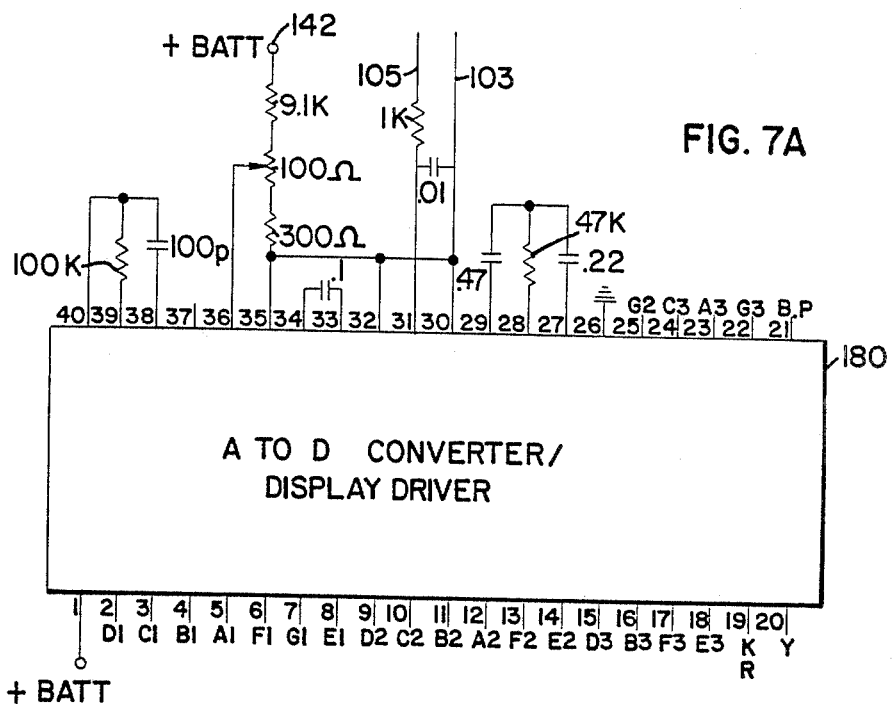
Figure 7B:
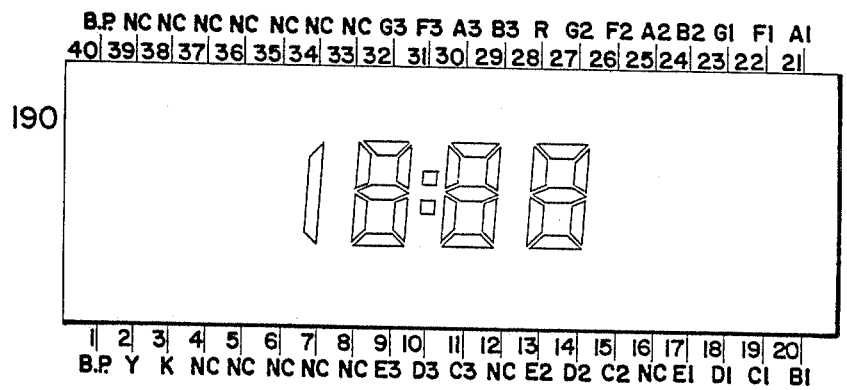

The electrical aspects of the present invention are schematically illustrated in FIGS. 7, 7A and 7B. Terminals 100 and 101 are electrically connected to the black and red lead wires 28 and 30 respectively, by permanent solder connection. The voltage applied at terminal 101 establishes the test voltage ground on conductors 102 and 103. An RF shield 154 also connected to test voltage ground. Physically, the shield plate is glued to the inside bottom of base 15, below circuit board 50. Resistors 106-109 form a voltage divider between terminals 100 and 101 to step down the applied input voltage. Although not shown for the sake of clarity, the present embodiment includes a 100Ω resistor and a 0.001 μf capacitor which are connected in series with one another and in parallel with resistors 108 and 109, from conductor 110 to ground 102, to form a filter. The stepped down voltage is received on conductor 110 and applied to a DC blocking capacitor 111 and to contacts 125 and 129 of switch 115. Terminal 100 is further connected through a resistance 112 to contacts 121 and 123. Terminal 101 is connected through a resistance 113 to contacts 122 and 124. A nine volt battery 130 is connected at its anode to contacts 130 and 133, its cathode establishing ground for the integrated circuit components, as identified by symbol 141. The switched battery voltage appears at a contact 142, which is connected to switch contacts 131, 132 and 134. The output 145 of AC rectifying circuit 150 is connected to contact 127.

Switch 115 include 3 ganged slide members 116, 117 and 118. In a first BATT (battery/continuity) position contacts 120 and 121, 129 and 128, and 130 and 131 are connected; in a second OFF position (as illustrated) contacts 121 and 122, 128 and 127, and 131 and 132 are connected; in a third AC test position contacts 122 and 123, 127 and 126, and 132 and 20 133 are connected; in a fourth DC test position contacts 123 and 124, 126 and 125, and 133 and 134 are connected.

In the illustrated OFF position, terminal 100 is connected through resistance 112 and 113 to terminal 101 with battery power terminal 142 disconnected from battery 140. Thus, the integrity circuit components, including the LCD display, are deenergized and any power applied to the probes is stepped down to a safe level before it reaches switch contacts 121 and 122, thereby avoiding or preventing series shock in the event of mechanical or electrical breakdown of that component.

In the BATT position terminal 100 is connected through the resistance 112 and 113 to terminal 101 and through resistances 106, 107 and through a conductor 105 to an input of the analog to digital (A to D) converter 180. The other test voltage input to A to D converter 180 is taken from conductor 103, which is connected to ground terminal 101. Battery terminal 142 is connected to battery 140 to energize the electronic integrated circuits whereby lead continuity may be verified. With the lead open the LCD display reads 003 or higher for a good battery. With the probe leads in contact with one another the display should read 0, or else an open circuit is indicated. In the AC test position, the output of AC rectifier 150 is connected to the high input 105 of convertor 180 and terminal 101 is connected through a resistance 113 and 112 to terminal 100 to shunt voltage away from divider network 106-109 whereby safe and measureable AC voltages are applied to the DC blocking capacitor 111 of rectifier 150. Rectifier 150 converts this stepped down AC input signal to a DC voltage as is conventionally known, over a wide range of frequencies with a precision of 0.2% or better, with the output voltage being converted from analog to digital form in convertor 180. Preferably rectifier 150 includes operational amplifier 152 for design simplicity, rather than a transistor network. Amplifier 152 is an industry standard CA3140E, having high input impedance.

In the DC test position terminal 100 is connected through resistances 106 and 107 to conductor 105 for input to converter 180 and through resistances 112 and 113 to terminal 101. Thus, in this position a stepped down direct input is taken from terminal 100 and applied to lead conductor 105 for input to the converter 180. A resistance 181 and capacitance 182 are provided between low side conductor 103 and high side conductor 105 to shunt away AC components, whereby a DC voltage level may be separated from any AC components.

The A to D converter used in the present embodiment is an industry standard ICL 7106 CPL, known to be fabricated by Intersil Inc., 10710 N. Tantau Avenue, Cooperatino, CA 95014 for one. It is connected to LCD 190 as indicated by the corresponding lettering on the numbered pins of each circuit, through any conventional means, printed circuit in the present embodiment. LCD 190 is an industry standard LCC 35051, manufactured for one by Fema Corporation 30 12-6 Edgeboro Road, E. Brunswick, N.J. 08816.

The present invention features auto-zeroing, as provided for by the feedback network of rectifier 150 while in the AC test mode, and by the resistive coupling of the test probes while in the DC test mode, as will be appeciated by those skilled in the art.

In the BATT (battery/continuity) mode, with the probes open, a battery level indication is obtained by grounding conductor 155 to battery 140 ground 141 through contact 120. The voltage divider created by 112, 106, 107, 108 and 109 presents a negative voltage at 110, since analog ground points 102 and 103 are regulated by the A to D convertor 180 via pin 32 to about 2.8 volts below + BATT. The value of 112 has been selected such that a negative voltage is provided at the input to A to D convertor 180 equivalent to one-half the battery voltage. If the ready produced in the BATT mode (probes open) is in excess of 3, battery voltage is sufficient for operation. If below, it should be replaced. In testing continuity, either of the probes 22 and 24 and leads 28 and 30, or of any circuit therebetween, a closed circuit between the probes imposes analog ground on both ends of divider network 106, 107, 108 and 109. If the circuit being tested for continuity has relatively low resistance, the differential voltage applied to convertor 180 is zero.

If maximum voltage is applied to probes, 22 and 24 while in the BATT (battery/continuity) mode no damage occurs since 2.7 megohms of current limiting (resistance 112) is always present.

Thus, the present invention provides a simple yet powerful test instrument for the electrician. With a single setting of the control switch 115 both battery voltage and lead continuity may be quickly and easily detected, thus assuring the veracity of subsequent test readings. AC and DC test modes may also be switched easily, and no range settings need be made, minimizing the risk of erroneous readings due to incorrect settings and reducing the time required to perform a test. Also, there is no danger of overloading the continuity circuit. Moreover, the present invention is easy to hold and switch with one hand, and includes an easy to read digital display whereby the reading errors commonly associated with analog scales are eliminated.

It will be understood from the foregoing description of the various embodiments and modifications, that additional modifications, and changes in form and details may be made without departing from the spirit and scope of the invention as claimed.

I claim:

1. A battery operated digital test intrument for measuring AC voltage, for measuring DC voltage and for performing self-test in three different modes, comprising:
   (a) first and second electrical probes including leads for probing circuits to be tested;
   (b) resistive divider network means electrically connected between said probes for stepping down measured voltages;
   (c) an AC rectifier for receiving through an AC coupling capacitor stepped down AC voltages from said probes and for producing a DC rectified voltage proportionate thereto;
   (d) a digital numerical display;
   (e) an analog to digital converter for receiving a voltage differential and driving said display according to the magnitude of the received differential; and
   (f) a slide switch for applying the output of said AC rectifier to said converter in the AC test mode, for applying the output of said resistive divider network to said converter in the DC test mode and for applying a battery supplied voltage bias proportional to said battery voltage between said probes in said self-test mode to cause said converter and LCD to display a battery level indication proportional to said battery voltage when said probes are open circuit indicating battery condition and to cause said converter to drive said LCD top a zero display state when said probes are shortened together indicating good probe continuity.

2. A battery operated voltage measuring instrument comprising:
   circuit means for measuring voltage and performing self-test in two different modes of operation respectively, said circuit means including:
   (a) first and second electrical probes including leads for probing voltages to be measured between said probes;
   (b) means for conditioning said voltages applied between said probes and producing a corresponding magnitude signal;
   (c) numeric display means for displaying measurements;
   (d) measurement means for receiving a voltage differential and driving said dispaly means according to the magnitude of the received differential; and
   (e) switch means operable in a first mode for applying the output of said conditioning means to said measurement means in voltage test mode and operable in a second mode for applying a battery supplied voltage bias proportional to said battery voltage between said probes in self-test mode to cause said measurement means and display means to display a battery level indication proportional to said battery voltage when said probes are open circuit and to cause said measurement means to drive said display means to a zero display state when said probes are shorted together and there is good probe continuity.

3. A test instrument according to claims 2 wherein said means for conditioning test voltages includes resistive bypass means connected between said probes to shunt excess voltage applied between said probes.

4. The device according to claim 2 wherein said conditioning means includes an AC to DC converter whereby the DC output of said conditioning means is proportionate in magnitude to the AC input.

5. The device according to claim 2 wherein said conditioning means includes a resistive divider network to step down input voltages to lower magnitudes.

6. A multi-mode battery operated test instrument comprising:
   test circuit means including first and second electrical probes including leads for probing circuits to be tested, display means and switch means for switching between test modes;

a housing including means for securing said test circuit means therewithin with said leads and probes extending outside and said display means and switch accessible by apertures therein;

strain relief means for mechanically anchoring said leads to said housing including an eyelet having a first washer-shaped end and a second tubular portion extending therefrom and sized to receive said lead snugly, said tubular portion slightly reduced in diameter near the end opposite said washer-shaped portion, said eyelet tubular portion being mechanically crimped around said lead and electrically connected to said lead by soldering, said eyelet being disposed inside said housing with said washer-shaped end facing outward and said lead extending through an aperture in said housing, said washer-shaped end of said eyelet abutting against the inside wall of said housing around said apertures so that mechanical stress applied thereto is applied to the inside wall of said housing.

* * * * *

UNITED STATES PATENT AND TRADEMARK OFFICE
CERTIFICATE OF CORRECTION

PATENT NO.　 :　 4,804,908
DATED　　　 :　 Feb. 14, 1989
INVENTOR(S) :　 Roger E. Mitchell It is certified that error appears in the above-identified patent and that said Letters Patent is hereby corrected as shown below:

Column 1, line 38, "eaasy" should be --easy--.

Column 1, line 55, "racing" should be --ranging--.

Column 3, line 57, "154" should be --152--.

Column 4, line 23, "integrity" should be --integrated--.

Column 4, line 39, "lead" should be --leads--.

Column 5, line 26, "ready" should be --reading--.

Column 6, line 19, "top" should be --to--.

Claim 3, line 1, "claims" should be --claim--.

Signed and Sealed this

Twenty-eighth Day of November 1989

Attest:

JEFFREY M. SAMUELS

*Attesting Officer*　　　Acting Commissioner of Patents and Trademarks